United States Patent
Dusenbury et al.

(10) Patent No.: US 11,300,342 B2
(45) Date of Patent: Apr. 12, 2022

(54) ELECTRONIC EXPANSION VALVE (EEV) CONTROLLER

(71) Applicants: Barry Lee Dusenbury, Shelbyville, IN (US); Stuart Smith, Indianapolis, IN (US)

(72) Inventors: Barry Lee Dusenbury, Shelbyville, IN (US); Stuart Smith, Indianapolis, IN (US)

(*) Notice: Subject to any disclaimer, the term of this patent is extended or adjusted under 35 U.S.C. 154(b) by 192 days.

(21) Appl. No.: 16/830,250

(22) Filed: Mar. 25, 2020

(65) Prior Publication Data
US 2020/0309438 A1    Oct. 1, 2020

Related U.S. Application Data

(60) Provisional application No. 62/823,479, filed on Mar. 25, 2019.

(51) Int. Cl.
| | |
|---|---|
| *F25B 49/02* | (2006.01) |
| *H05K 7/14* | (2006.01) |
| *H05K 3/30* | (2006.01) |
| *H05K 5/00* | (2006.01) |
| *F25B 41/34* | (2021.01) |

(52) U.S. Cl.
CPC .......... *F25B 49/025* (2013.01); *H05K 3/301* (2013.01); *H05K 5/0026* (2013.01); *H05K 7/1427* (2013.01); *F25B 41/34* (2021.01); *F25B 2600/2513* (2013.01); *F25B 2600/2519* (2013.01)

(58) Field of Classification Search
CPC ... F25B 49/025; F25B 41/31–35; H05K 3/30; H05K 3/301; H05K 5/0026; H05K 7/1427
USPC .................................. 361/752–753, 807–810
See application file for complete search history.

(56) References Cited

U.S. PATENT DOCUMENTS

| | | | | |
|---|---|---|---|---|
| 8,289,720 B2* | 10/2012 | Ishikawa | ................ | G03B 17/00 |
| | | | | 361/749 |
| 8,902,598 B2* | 12/2014 | Chin | .................... | H05K 7/1467 |
| | | | | 361/752 |
| 2013/0021062 A1* | 1/2013 | Sardat | ............... | H02M 3/33523 |
| | | | | 326/63 |
| 2013/0107401 A1* | 5/2013 | Helt | ........................ | H02H 7/09 |
| | | | | 361/33 |
| 2013/0264044 A1* | 10/2013 | Kearney | .................. | F25B 5/02 |
| | | | | 165/200 |

(Continued)

*Primary Examiner* — Tuan T Dinh (57) ABSTRACT

An electronic expansion valve (EEV) controller allows a user to drive the stepper motor of EEVs. Thus, the EEVs toggle between an open position or a closed position. The EEV controller includes a housing, a portable power supply, a motor driver printed circuit board (PCB), a power switch, a directional switch, and a motor connector. The housing is used to protect and hold in place the motor driver PCB, the portable power supply, the power switch, the directional switch, and the motor connector. The portable power supply is used to provide electrical energy to the motor driver PCB and to the stepper motor of EEVs through the motor connector. The power switch allows a user to manually turn on or off the EEV controller and the stepper motor. The directional switch is used to toggle the stepper motor between a clockwise rotation or a counter-clockwise rotation.

17 Claims, 6 Drawing Sheets

(56) References Cited

U.S. PATENT DOCUMENTS

2014/0225455 A1\* 8/2014 Erwin ............... H01H 9/20
 307/109
2015/0062844 A1\* 3/2015 Bae ............... H04M 1/0249
 361/752

\* cited by examiner

FIG. 6

ELECTRONIC EXPANSION VALVE (EEV) CONTROLLER

The current application claims a priority to the U.S. Provisional Patent application Ser. No. 62/823,479 filed on Mar. 25, 2019.

FIELD OF THE INVENTION

The present invention relates generally to an apparatus for electronic expansion valves (EEVs) using unipolar stepper motors. More specifically, the present invention is an apparatus for EEVs that allows the user to toggle the EEVs between an open position and a closed position.

BACKGROUND OF THE INVENTION

Electronic expansion valves (EEVs) control the flow of refrigerant in a HVAC system. The EEVs opened or closed through the actuation of a stepper motor. The stepper motor of EEVs do not rotate continuously and, thus, are controlled by electronic controller. An issue of using conventional electronic controllers for a stepper motor of EEVs is that an external power source is required in order to either power the printed circuit board (PCB) of the electrical controller or to directly power the stepper motor. Another issue is that the switches and connectors of conventional electronic controllers are found on the PCB of the electrical controller. The switches and connectors are not easily accessible to a user.

It is therefore an objective of the present invention to provide an EEV controller that allows a user to toggle EEVs between an open position and a closed position. This is accomplished through the use of a directional switch provided by the present invention. Another objective of the present invention is to provide a controller that does not require an external power source. This is accomplished through the use of a portable power supply that can power both the PCB and a stepper motor through a motor connector. Another objective of the present invention is to provide easily accessible switches and connectors in order to control the stepper motor of EEVs.

SUMMARY OF THE INVENTION

An electronic expansion valve (EEV) controller allows a user to drive the stepper motor of EEVs. Thus, the EEVs toggle between an open position or a closed position. The EEV controller includes a housing, a portable power supply, a motor driver printed circuit board (PCB), a power switch, a directional switch, and a motor connector. The housing is used to protect and hold in place the motor driver PCB, the portable power supply, the power switch, the directional switch, and the motor connector. The portable power supply is used to provide electrical energy to the motor driver PCB and to the stepper motor of EEVs through the motor connector. The power switch allows a user to manually turn on or off the EEV controller and the stepper motor. The directional switch is used to toggle the stepper motor between a clockwise rotation or a counter-clockwise rotation.

DETAIL DESCRIPTIONS OF THE INVENTION

All illustrations of the drawings are for the purpose of describing selected versions of the present invention and are not intended to limit the scope of the present invention.

In reference to FIGS. 1 through 6, the present invention is an electronic expansion valve (EEV) controller that allows a user to drive the stepper motor of variable refrigerant flow (VRF) EEVs in a clockwise (CW) direction or a counter-clockwise (CCW) direction. Thus, the EEVs can be toggled between an open position or a closed position. A preferred embodiment of the present invention comprises a housing 1, a portable power supply 8, a motor driver printed circuit board (PCB) 13, a power switch 18, a directional switch 19, and a motor connector 20. The housing 1 is used to conceal and protect the motor driver PCB 13, the portable power supply 8, the power switch 18, the directional switch 19, and the motor connector 20. The housing 1 is preferably made of a weather-resistant material such as, but not limited to, PTEG plastic in order for the housing 1 to effectively protect the electronic components of the present invention. The portable power supply 8 is used to provide electrical energy to the motor driver PCB 13 and to the stepper motor of EEVs through the motor connector 20. The motor driver PCB 13 is preferably a unipolar stepper motor driver PCB 13 in order to efficiently drive the stepper motor of EEVs. The power switch 18 allows a user to manually turn on or off the present invention. The directional switch 19 is used to either drive the stepper motor CW direction or CCW direction. The motor connector 20 allows the present invention to interface and control a stepper motor of EEVS.

Figure 1:
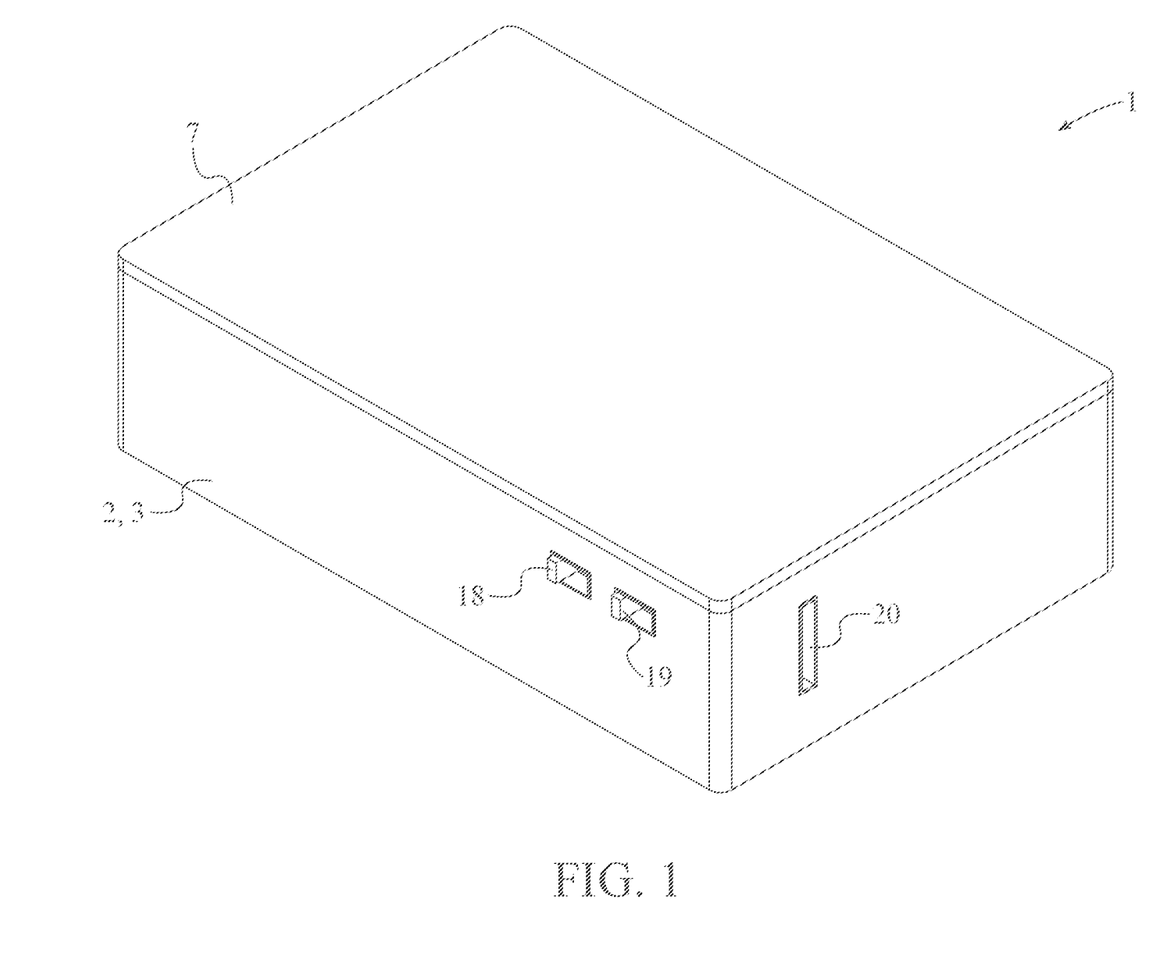
FIG. 1 is a front perspective view of the present invention.
Figure 2:
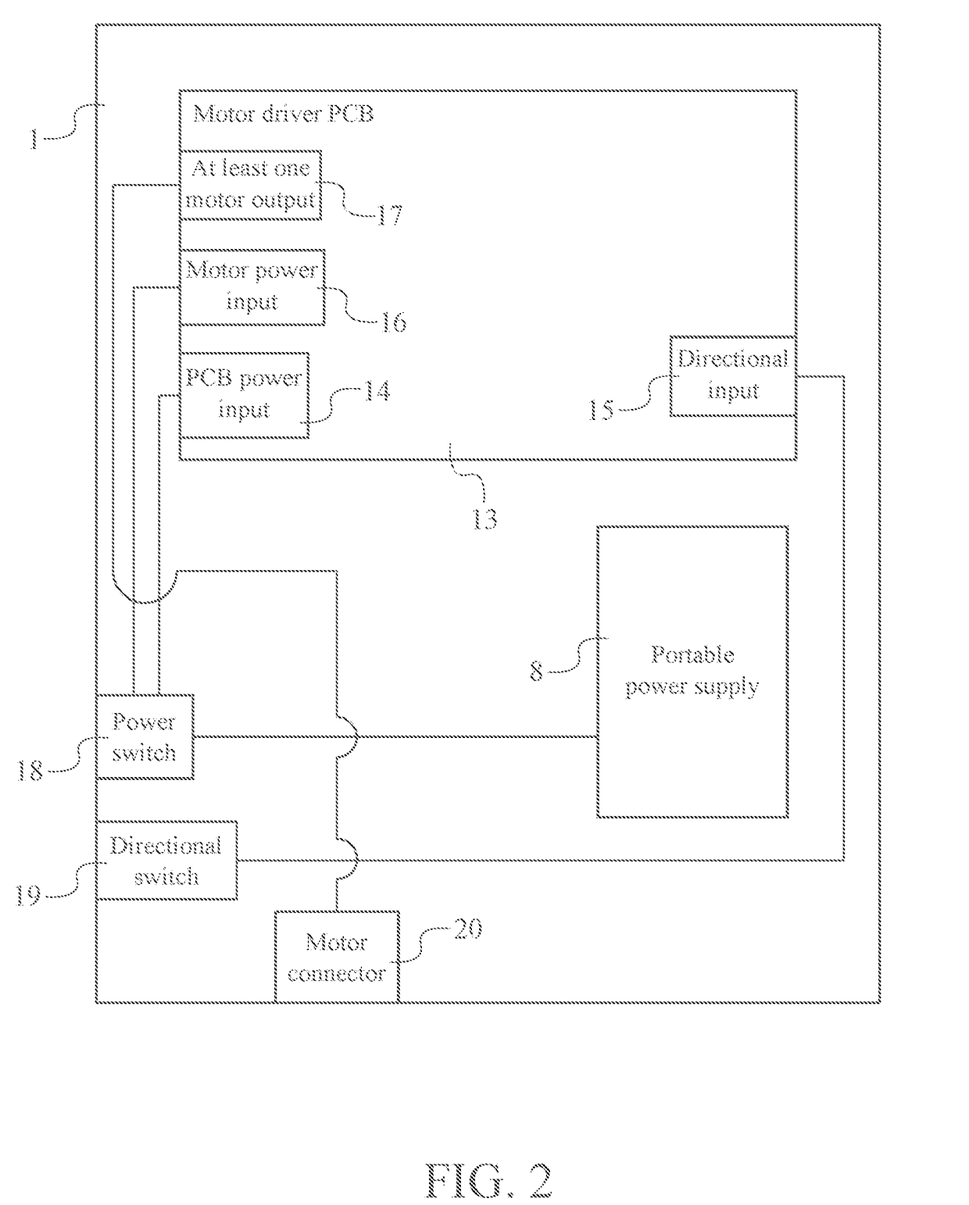
FIG. 2 is a schematic view displaying the electrical connections of the present invention.

The general configuration of the aforementioned components allows the present invention to toggle EEVs between an open position or a closed position. With reference to FIGS. 1 and 2, the motor driver PCB 13 comprises a PCB power input 14, a directional input 15, a motor power input 16, and at least one motor output 17. The portable power supply 8 and the motor driver PCB 13 are mounted within the housing 1 in order to be concealed and protected by the housing 1. The power switch 18, the directional switch 19, and the motor connector 20 are integrated into the housing 1 in order to be concealed and protected by the housing 1 while still allowing a user to easily access the power switch 18, the directional switch 19, and the motor connector 20. The portable power supply 8 is electrically connected to the PCB power input 14 through the power switch 18. In further detail, the portable power supply 8 is electrically connected to a first input of the power switch 18, and a first output of the power switch 18 is electrically connected to the PCB power input 14. Thus, the motor driver PCB 13 can receive electrical energy from the portable power supply 8. Further, the portable power supply 8 is electrically connected to the motor power input 16 through the power switch 18. In further detail, the portable power supply 8 is electrically connected to a second input of the power switch 18, and a second output of the power switch 18 is electrically connected to the motor power input 16. Thus, the motor driver PCB 13 can route electrical energy from the portable power supply 8 to the at least one motor output 17. Moreover, the at least one motor output 17 is electrically connected to the motor connector 20. Thus, the present invention can supply electrical energy to the stepper motor of EEVs through the motor connector 20. Due to the common electrical connection type of stepper motors of EEVs and the type of electrical connection of the at least one motor output 17, the motor connector 20 is preferably a 6-pin female connector. The directional switch 19 is electrically connected to the directional input 15. The directional switch 19 is preferably a single pole double throw (SPDT) switch in order to toggle a CW motor spin output and a CCW motor spin output. Thus, the stepper motor can be driven in a CW direction or a CCW direction by manually toggling the directional switch 19.

Figure 3:
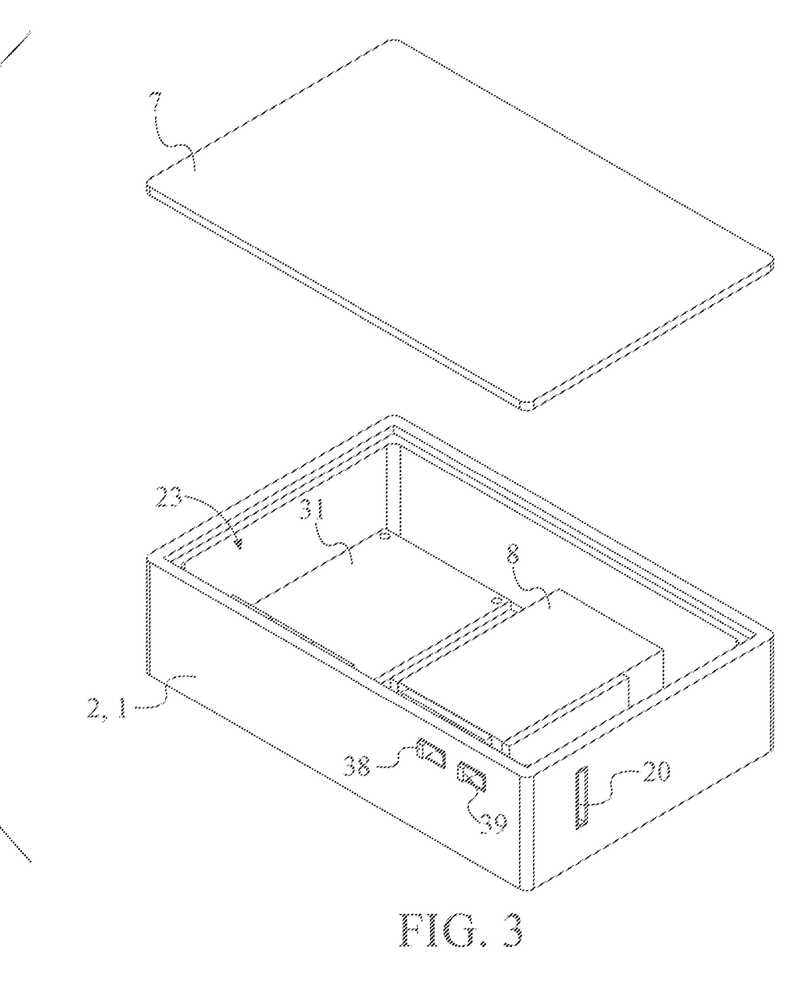
FIG. 3 is an exploded perspective view of the present invention with the cover.
Figure 4:
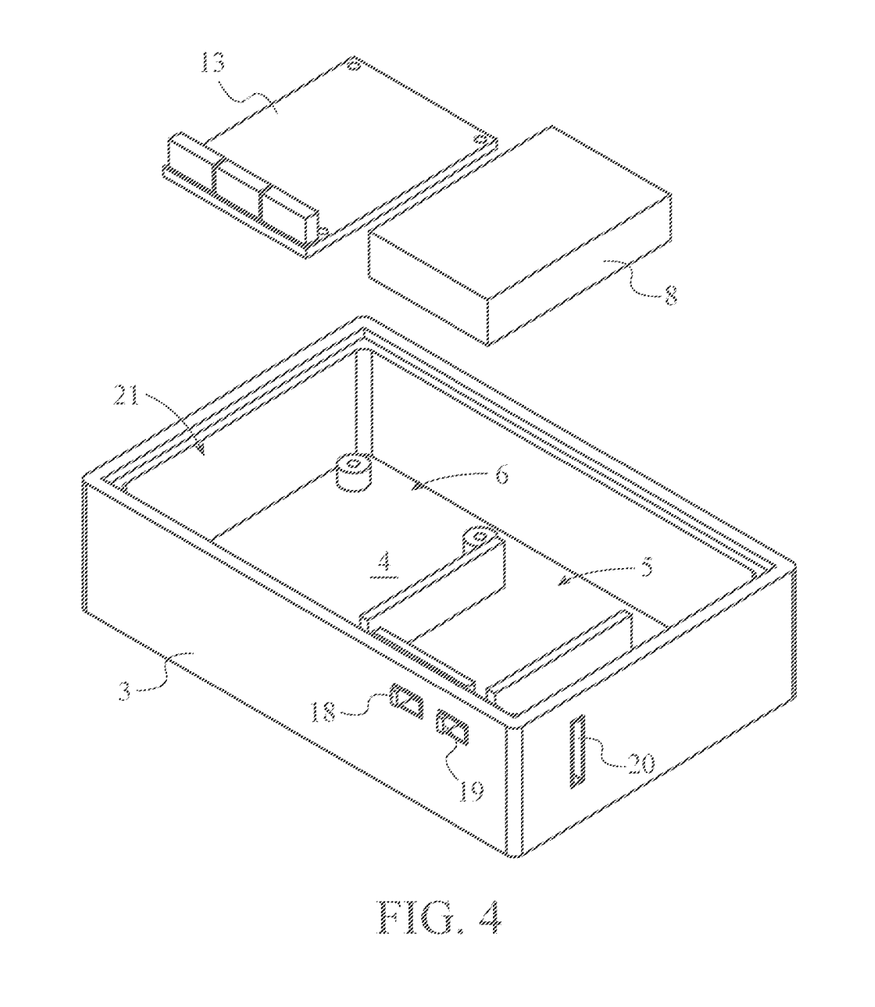
FIG. 4 is an exploded perspective view of the present invention without the cover.
Figure 5:
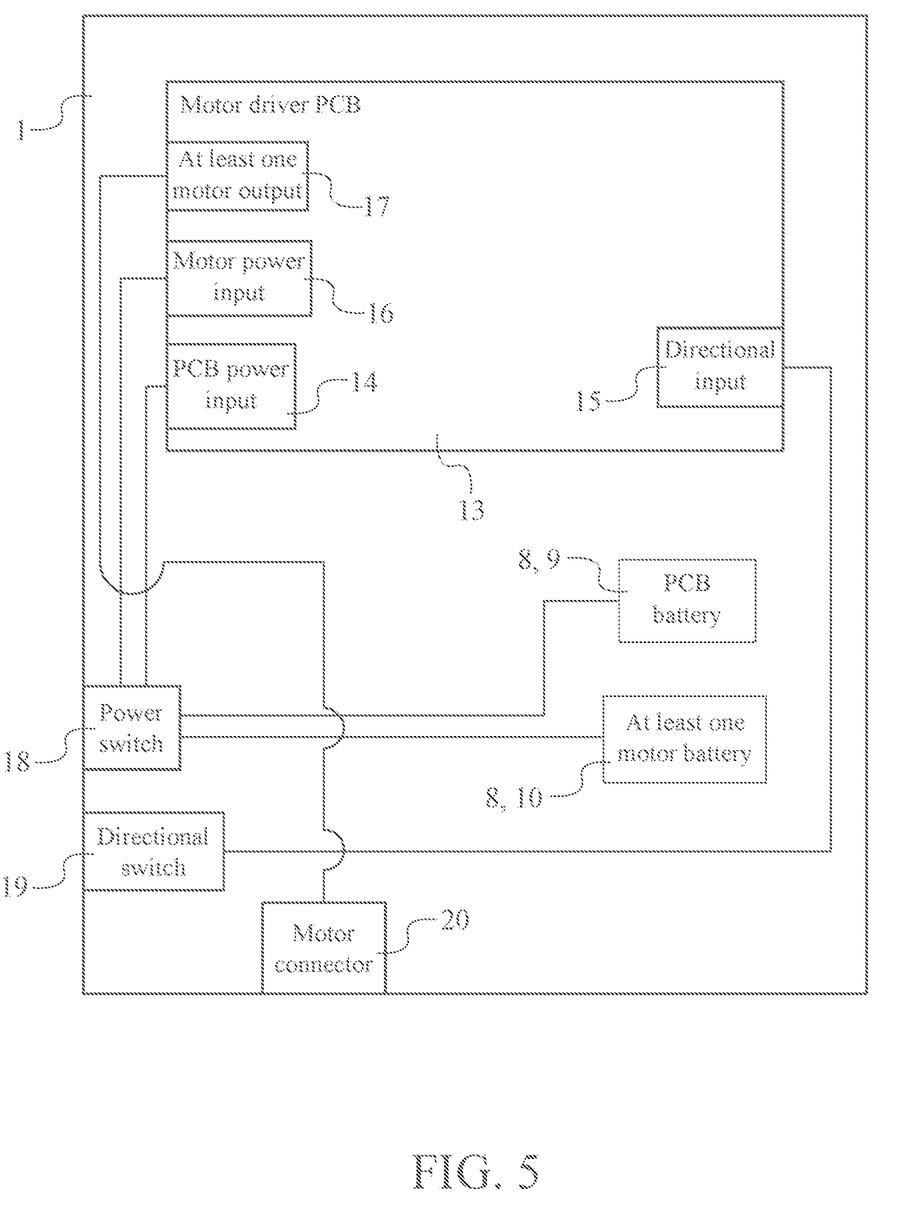
FIG. 5 is a schematic view displaying one embodiment of the portable power supply.

With reference to FIGS. 3 and 4, the housing 1 may further comprise a receptacle 2, at least one power supply compartment 5, and a PCB compartment 6 in order to effectively conceal and protect the portable power supply 8 and the motor driver PCB 13. The at least one power supply compartment 5 and the PCB compartment 6 are positioned within the receptacle 2. Thus, the portable power supply 8 and the motor driver PCB 13 can be fully concealed and held in place by the housing 1. Further, the at least one power supply compartment 5 is positioned adjacent to the PCB compartment 6. This arrangement separates the at least one power supply compartment 5 and the PCB compartment 6 while still keeping the at least one supply and the PCB compartment 6 close to each other in order to efficiently establish the electrical connections of the present invention. The portable power supply 8 is positioned within the at least one power supply compartment 5 in order to be effectively protected and held in place by the housing 1. The motor driver PCB 13 is positioned within the PCB compartment 6 in order to be effectively protected and held in place by the housing 1.

With reference to FIG. 3, the housing 1 may further comprise a cover 7 in order to allow a user to access the electronic components of the present invention for maintenance or replacement. The cover 7 is positioned into an opening of the receptacle 2, and the receptacle 2 is perimetrically attached to the cover 7. This arrangement allows the cover 7 to be attached or removed when desired. Thus, a user can easily access the electronic components of the present invention by removing the cover 7. Further and with reference to FIG. 4, the receptacle 2 comprises a lateral portion 3 and a base portion 4. The at least one power supply compartment 5 and the PCB compartment 6 are integrated across the base portion 4 in order to provide enough space for the portable power supply 8 and the motor driver PCB 13. The power switch 18, the directional switch 19, and the motor connector 20 are integrated into the lateral portion 3 in order to be easily accessible as the base portion 4 is situated upon a surface. The power switch 18 and the directional switch 19 are positioned adjacent to each other in order for the user to quickly change spin direction of a stepper motor or to turn on or off the present invention. The motor connector 20 is positioned offset from the power switch 18 and the directional switch 19 about the lateral portion 3. This arrangement prevents interference of a user accessing the power switch 18 and the directional switch 19 as the motor connector 20 is cabled to a stepper motor.

The power switch 18 is preferably a double pole double throw (DPDT) switch. This allows the power switch 18 to receive two inputs and provide multiple outputs. For example, with reference to FIG. 5, and in one embodiment of the portable power supply 8, the portable power supply 8 comprises a PCB battery 9 and at least one motor battery 10. The PCB battery 9 is preferably a 9-volt battery. The at least one motor battery 10 is preferably a 9-volt battery and two 1.5-volt batteries. The PCB battery 9 is electrically connected to the PCB power input 14 through the power switch 18, and the at least one motor battery 10 is connected to the motor power input 16 through the power switch 18. The PCB battery 9 and the at least one motor battery 10 are electrically connected to the power switch 18 as the first input of the power switch 18 and the second input of the power switch 18, respectively. This arrangement allows the power switch 18 to route electrical energy from the PCB battery 9 to the motor driver PCB 13 and to route electrical energy from the at least one motor battery 10 to a stepper motor of EEVs through the motor connector 20.

Figure 6:
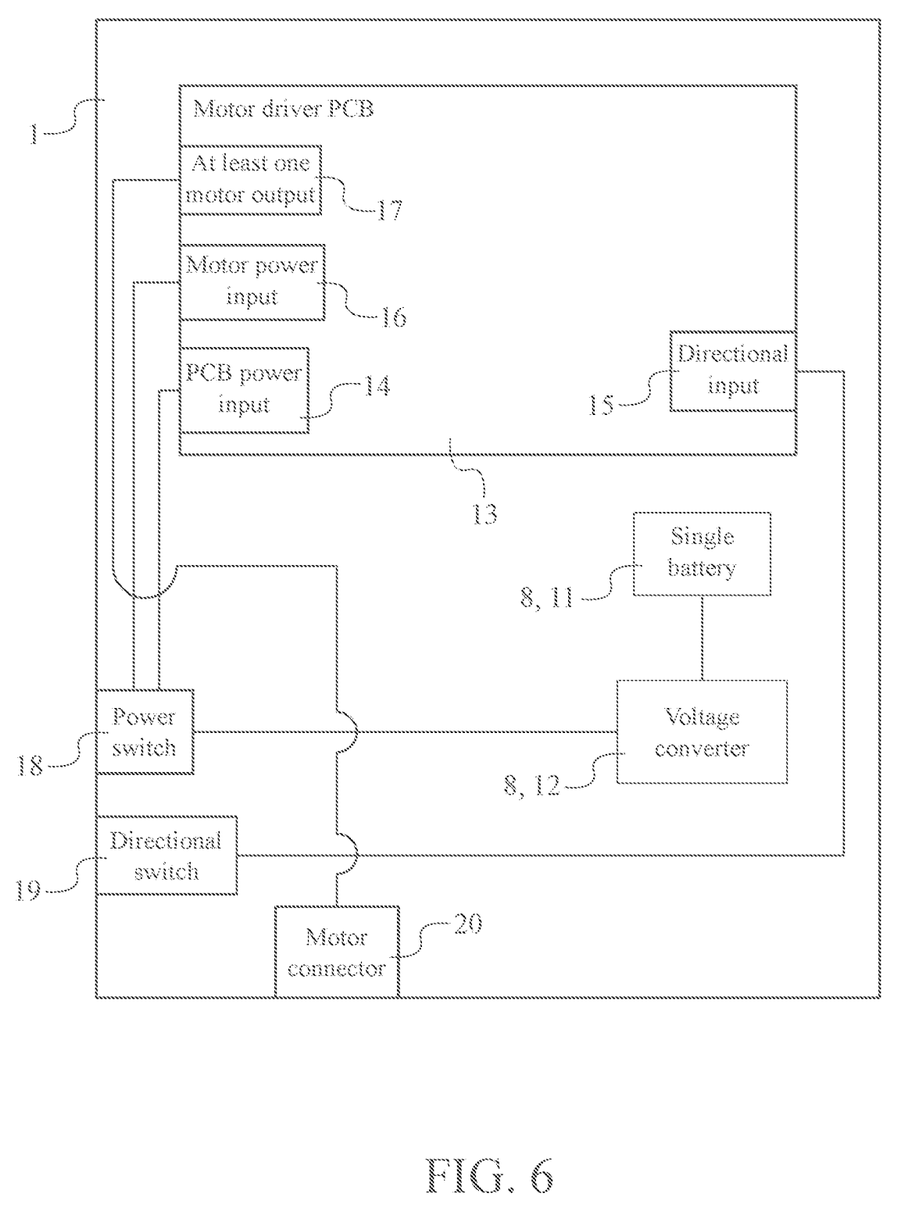
FIG. 6 is a schematic view displaying another embodiment of the portable power supply.

In another embodiment of the portable power supply 8 and with reference to FIG. 6, the portable power supply 8 comprises a single battery 11 and a voltage converter 12. The voltage converter 12 is used to adjust the voltage of the single battery 11 in order for the single battery 11 to be used to safely provide electrical energy to both the motor driver PCB 13 and a stepper motor of EEVs through the motor connector 20. The single battery 11 is electrically connected to the voltage converter 12 and is preferably a 9-volt battery. This arrangement allows the voltage of the single battery 11 to be regulated by the voltage converter 12. The voltage converter 12 is electrically connected to the PCB power input 14 through the power switch 18, which allows the voltage converter 12 to output electrical energy at a voltage that is catered for the motor drive PCB 13 to safely function. Moreover, the voltage converter 12 is electrically connected to the motor power input 16 through the power switch 18, which allows the voltage converter 12 to output electrical energy at a voltage that is catered for a stepper motor of EEVs to safely function.

Although the invention has been explained in relation to its preferred embodiment, it is to be understood that many other possible modifications and variations can be made without departing from the spirit and scope of the invention as hereinafter claimed.

What is claimed is:

1. An electronic expansion valve (EEV) controller comprises:
    a housing;
    a portable power supply;
    a motor driver printed circuit board (PCB);
    a power switch;
    a directional switch;
    a motor connector;
    the motor driver PCB comprises a PCB power input, a directional input, a motor power input, and at least one motor output;
    the portable power supply and the motor driver PCB being mounted within the housing;
    the power switch, the directional switch, and the motor connector being integrated into the housing;
    the portable power supply being electrically connected to the PCB power input through the power switch;
    the portable power supply being electrically connected to the motor power input through the power switch;
    the directional switch being electrically connected to the directional input; and
    the at least one motor output being electrically connected to the motor connector.

2. The EEV controller as claimed in claim 1 comprises:
    the housing comprises a receptacle, at least one power supply compartment, and a PCB compartment;

the at least one power supply compartment and the PCB compartment being positioned within the receptacle;

the at least one power supply compartment being positioned adjacent to the PCB compartment;

the portable power supply being positioned within the at least one power supply compartment; and the motor driver PCB being positioned within the PCB compartment.

3. The EEV controller as claimed in claim 2 comprises:
the housing further comprises a cover;
the cover being positioned into an opening of the receptacle; and
the receptacle being perimetrically attached to the cover.

4. The EEV controller as claimed in claim 2 comprises:
the receptacle comprises a lateral portion and a base portion;
the at least one power supply compartment and the PCB compartment being integrated across the base portion;
the power switch, the directional switch, and the motor connector being integrated into the lateral portion;
the power switch and the directional switch being positioned adjacent to each other; and
the motor connector being positioned offset from the power switch and the directional switch about the lateral portion.

5. The EEV controller as claimed in claim 1 comprises:
the portable power supply comprises a PCB battery and at least one motor battery;
the PCB battery being electrically connected to the PCB power input through the power switch; and
the at least one motor battery being electrically connected to the motor power input through the power switch.

6. The EEV controller as claimed in claim 1 comprises:
the portable power supply comprises a single battery and a voltage converter;
the single battery being electrically connected to the voltage converter;
the voltage converter being electrically connected to the PCB power input through the power switch; and
the voltage converter being electrically connected to the motor power input through the power switch.

7. The EEV controller as claimed in claim 1 comprises:
the housing being made of a weather-resistant material.

8. The EEV controller as claimed in claim 1 comprises:
the power switch being a double pole double throw (DPDT) switch.

9. The EEV controller as claimed in claim 1 comprises:
the directional switch being a single pole double throw (SPDT) switch.

10. The EEV controller as claimed in claim 1 comprises:
the motor driver PCB being a unipolar stepper motor driver PCB.

11. The EEV controller as claimed in claim 1 comprises:
the motor connector being a 6-pin female connector.

12. An electronic expansion valve (EEV) controller comprises:
a housing;
a portable power supply;
a motor driver printed circuit board (PCB);
a power switch;
a directional switch;
a motor connector;

the motor driver PCB comprises a PCB power input, a directional input, a motor power input, and at least one motor output;

the housing comprises a receptacle, at least one power supply compartment, and a PCB compartment;

the portable power supply and the motor driver PCB being mounted within the housing;

the power switch, the directional switch, and the motor connector being integrated into the housing;

the portable power supply being electrically connected to the PCB power input through the power switch;

the portable power supply being electrically connected to the motor power input through the power switch;

the directional switch being electrically connected to the directional input;

the at least one motor output being electrically connected to the motor connector;

the at least one power supply compartment and the PCB compartment being positioned within the receptacle;

the at least one power supply compartment being positioned adjacent to the PCB compartment;

the power switch being a double pole double throw (DPDT) switch;

the directional switch being a single pole double throw (SPDT) switch;

the motor driver PCB being a unipolar stepper motor driver PCB; and the motor connector being a 6-pin female connector.

13. The EEV controller as claimed in claim 12 comprises:
the housing further comprises a cover;
the cover being positioned into an opening of the receptacle; and
the receptacle being perimetrically attached to the cover.

14. The EEV controller as claimed in claim 12 comprises:
the receptacle comprises a lateral portion and a base portion;
the at least one power supply compartment and the PCB compartment being integrated across the base portion;
the power switch, the directional switch, and the motor connector being integrated into the lateral portion;
the power switch and the directional switch being positioned adjacent to each other; and
the motor connector being positioned offset from the power switch and the directional switch about the lateral portion.

15. The EEV controller as claimed in claim 12 comprises:
the portable power supply comprises a PCB battery and at least one motor battery;
the PCB battery being electrically connected to the PCB power input through the power switch; and
the at least one motor battery being electrically connected to the motor power input through the power switch.

16. The EEV controller as claimed in claim 12 comprises:
the portable power supply comprises a single battery and a voltage converter;
the single battery being electrically connected to the voltage converter;
the voltage converter being electrically connected to the PCB power input through the power switch; and
the voltage converter being electrically connected to the motor power input through the power switch.

17. The EEV controller as claimed in claim 12 comprises:
the housing being made of a weather-resistant material.

* * * * *